(12) United States Patent
Hamano et al.

(10) Patent No.: US 10,665,768 B2
(45) Date of Patent: May 26, 2020

(54) THERMOELECTRIC CONVERSION MODULE PACKAGE

(71) Applicants: YAMAHA CORPORATION, Hamamatsu-shi (JP); TOPPAN PRINTING CO., LTD., Tokyo (JP); TOYOTA TSUSHO CORPORATION, Nagoya-shi (JP)

(72) Inventors: Tetsutsugu Hamano, Fukuroi (JP); Takahiro Hayashi, Hamamatsu (JP); Yuma Horio, Hamamatsu (JP); Tomoaki Taniguchi, Tokyo (JP); Yuki Muroi, Tokyo (JP); Takashi Nakamura, Nagoya (JP)

(73) Assignees: YAMAHA CORPORATION, Hamamatsu-Shi (JP); TOPPAN PRINTING CO., LTD., Tokyo (JP); TOYOTA TSUSHO CORPORATION, Nagoya-Shi (JP)

( * ) Notice: Subject to any disclaimer, the term of this patent is extended or adjusted under 35 U.S.C. 154(b) by 0 days.

(21) Appl. No.: 16/158,980

(22) Filed: Oct. 12, 2018

(65) Prior Publication Data

US 2019/0081226 A1 Mar. 14, 2019

Related U.S. Application Data

(63) Continuation of application No. PCT/JP2017/015401, filed on Apr. 14, 2017.

(30) Foreign Application Priority Data

Apr. 15, 2016 (JP) .................................. 2016-081728

(51) Int. Cl.
*H01L 35/10* (2006.01)
*H01L 35/32* (2006.01)
(Continued)

(52) U.S. Cl.
CPC .............. *H01L 35/30* (2013.01); *H01L 23/38* (2013.01); *H01L 35/10* (2013.01); *H01L 35/32* (2013.01)

(58) Field of Classification Search
CPC ......... H01L 35/10; H01L 35/02; H01L 35/04; H01L 35/32
See application file for complete search history.

(56) References Cited

U.S. PATENT DOCUMENTS

| 3,225,549 A | 12/1965 | Elfving |
| 2006/0005873 A1 | 1/2006 | Kambe et al. |

(Continued)

FOREIGN PATENT DOCUMENTS

| JP | H10284761 A | 10/1998 |
| JP | 2000188430 A | 7/2000 |

(Continued)

OTHER PUBLICATIONS

Itakura et al. JP H10284761A, English machine translation (Year: 1998).*

(Continued)

*Primary Examiner* — Susan D Leong
(74) *Attorney, Agent, or Firm* — Rossi, Kimms & McDowell LLP

(57) ABSTRACT

A thermoelectric conversion module package includes: a thermoelectric conversion module including a first and a second substrate opposed to each other, a plurality of thermoelectric elements arranged between the first and second substrates, and a first and a second lead wire drawn out from one of the first and second substrates; and a package including a first metal foil covering the first substrate of the thermoelectric conversion module, a second metal foil covering the second substrate of the thermoelectric conversion module, a resin portion hermetically connecting the first (Continued)

metal foil and the second metal foil along an outer edge portion of the thermoelectric conversion module, and an insertion portion for hermetically passing the first and second lead wires through the resin portion.

6 Claims, 7 Drawing Sheets

(51) Int. Cl.
    *H01L 35/30*     (2006.01)
    *H01L 23/38*     (2006.01)

(56) References Cited

U.S. PATENT DOCUMENTS

2011/0185715 A1* 8/2011 Limbeck ............... F01N 5/025
                                                           60/320
2017/0279027 A1    9/2017 Himmer et al.

FOREIGN PATENT DOCUMENTS

| JP | 2001144337 A | 5/2001 |
|---|---|---|
| JP | 2001165525 A | 6/2001 |
| JP | 2003142739 A | 5/2003 |
| JP | 2006049872 A | 2/2006 |
| WO | 2016041690 A1 | 3/2016 |

OTHER PUBLICATIONS

Onoe JP2003142739, English machine translation (Year: 2003).*
Kanbe et al. JP2006049872A, English machine translation (Year: 2006).*
Ri et al. JP20011655525A, English machine translation (Year: 2001).*
International Search Report issued in Intl. Appln. No. PCT/JP2017/015401 dated Jul. 4, 2017. English translation provided.
Written Opinion issued in Intl. Appln. No. PCT/JP2017/015401 dated Jul. 4, 2017.
Extended European Search Report issued in European Appln. No. 17782548.6 dated Oct. 1, 2019.

* cited by examiner

THERMOELECTRIC CONVERSION MODULE PACKAGE

PRIORITY CLAIM

This application is continuation application of a PCT Application No. PCT/JP2017/015401, filed on Apr. 14, 2017, entitled "THERMOELECTRIC CONVERSION MODULE PACKAGE" whose priority is claimed on Japanese Patent Application No. 2016-081728, filed on Apr. 15, 2016. The description thereof is incorporated herein by reference.

BACKGROUND OF THE INVENTION

Field of the Invention

The present invention relates to a thermoelectric conversion module package in which a thermoelectric conversion module is sealed with a package.

Description of Related Art

A thermoelectric conversion module can be used as a cooling module utilizing the Peltier effect of a thermoelectric material or as a power generation module utilizing the Seebeck effect of a thermoelectric material. With the expansion of applications of thermoelectric conversion modules, thermoelectric conversion modules have come to be used in various environments. In a thermoelectric conversion module, performance deteriorates due to oxidation and corrosion of the thermoelectric material.

Japanese Unexamined Patent Application, Publication No. 2006-49872 discloses a thermoelectric conversion module capable of preventing oxidation and corrosion of the thermoelectric material. This thermoelectric conversion module has a structure hermetically sealed with a package constituted from a metallic cooling plate covering the low-temperature side substrate and a metallic lid covering the high-temperature side substrate. Therefore, in this thermoelectric conversion module, since the thermoelectric material does not come into contact with the external environment, excellent environmental resistance can be obtained.

In the thermoelectric conversion module according to the above document, the metallic cooling plate and the metallic lid are joined by means such as welding or the like. Therefore, in this thermoelectric conversion module, since the metallic cooling plate and the metallic lid are thermally connected, it is difficult for a temperature difference to arise between the low temperature-side substrate and the high temperature-side substrate. As a result, in this thermoelectric conversion module, cooling performance and power generation performance are greatly reduced.

Further, in the thermoelectric conversion module according to the above document, lead wires are drawn out from the metallic lid. Since both the lead wires and the metallic lid are made of metal, in this thermoelectric conversion module a constitution is required for electrically insulating the lead wires and the metallic lid and for hermetically sealing the lead wires and the metallic lid. For this reason, in this thermoelectric conversion module, the manufacturing process becomes complicated and the manufacturing cost increases.

SUMMARY OF THE INVENTION

In view of the circumstances described above, an object of the present invention is to provide a configuration capable of easily sealing a thermoelectric conversion module with a package without impairing the performance thereof.

To achieve the object, a thermoelectric conversion module package according to one embodiment of the present invention is provided with a thermoelectric conversion module and a package.

The thermoelectric conversion module includes a first and a second substrate opposed to each other, a plurality of thermoelectric elements arranged between the first and second substrates, and a first and a second lead wire drawn out from one of the first and second substrates.

The package includes a first metal foil covering the first substrate on one side of the thermoelectric conversion module, a second metal foil covering the second substrate on the other side of the thermoelectric conversion module, a resin portion hermetically connecting the first metal foil and the second metal foil along an outer edge portion of the thermoelectric conversion module, and an insertion portion for hermetically passing the first and second lead wires through the resin portion.

The second metal foil may have a side wall portion extending toward the first metal foil at the outer edge portion of the thermoelectric conversion module, and a flange portion protruding outward from the side wall portion.

The resin portion may connect the first metal foil and the flange portion.

The resin portion may be disposed at a position closer to the first substrate than the second substrate.

The first metal foil may have an expansion portion that is expanded outward from a region facing the first substrate.

The resin portion may connect the expansion portion and the flange portion.

The thermoelectric conversion module may be configured as an assembly including a plurality of the thermoelectric conversion modules.

A connecting portion for electrically connecting the plurality of thermoelectric conversion modules may be further provided.

EMBODIMENTS FOR CARRYING OUT THE INVENTION

Figure 1:
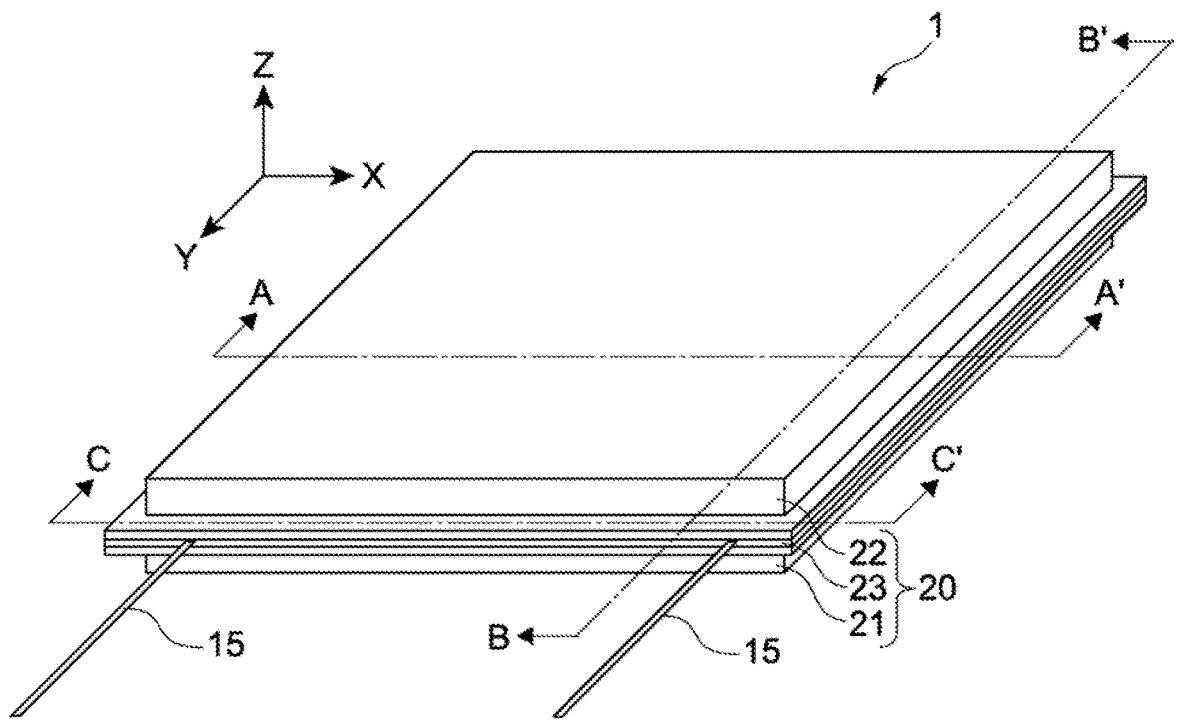
FIG. 1 is a perspective view showing a thermoelectric conversion module package according to one embodiment of the present invention.

Hereinbelow, an embodiment of the present invention will be described with reference to the drawings.

In the drawings, mutually orthogonal X-, Y-, and Z-axes are shown as appropriate. The X axis, the Y axis, and the Z axis are common to all the drawings. In each axis, the direction indicated by the arrow is called the positive direction, while the direction opposite to the direction indicated by the arrow is called the negative direction.

[Overall Configuration of Thermoelectric Conversion Module Package 1]

Figure 2:
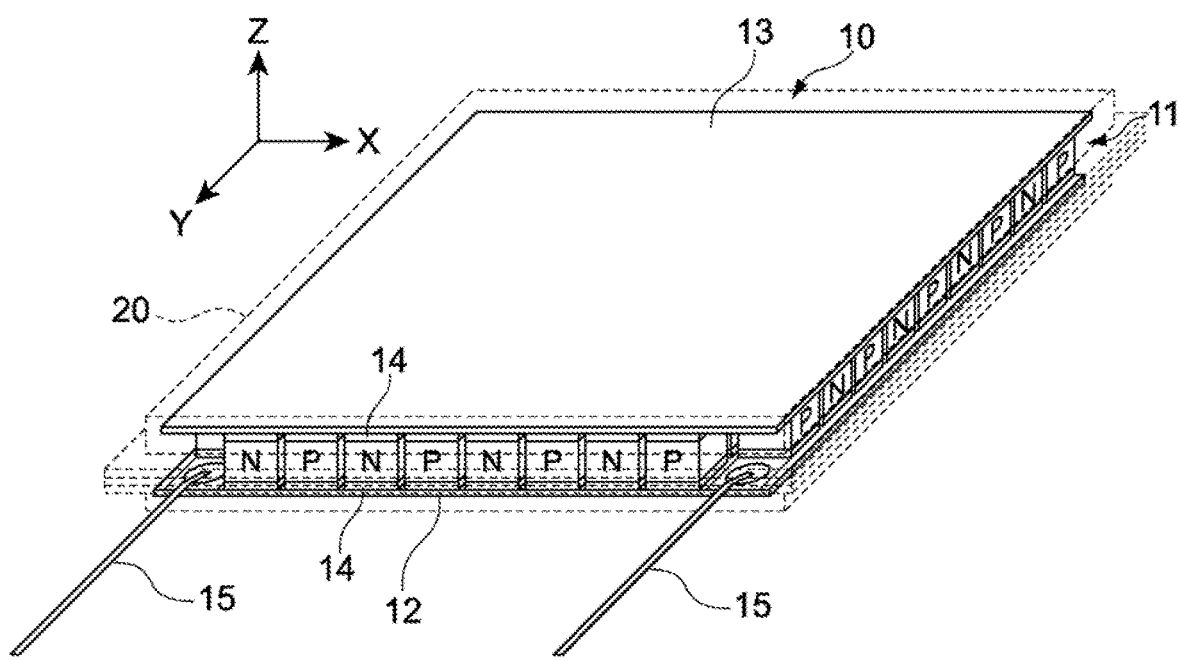
FIG. 2 is a perspective view showing the thermoelectric conversion module package, looking through the package.
Figure 3:
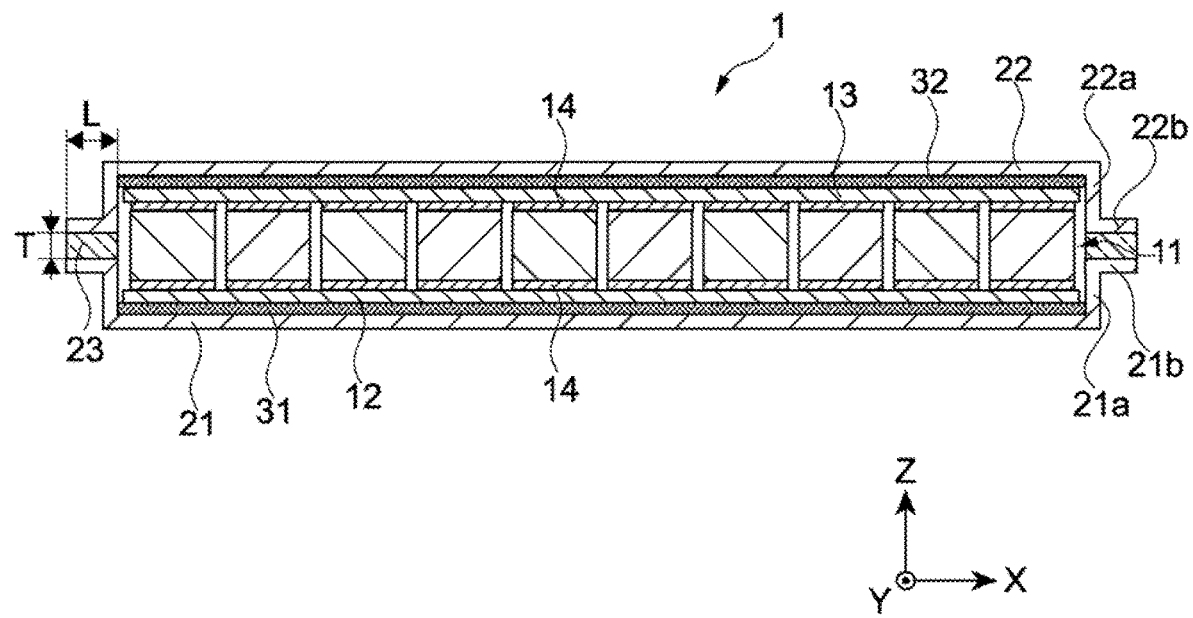
FIG. 3 is a cross-sectional view of the thermoelectric conversion module package taken along line A-A' in FIG. 1.
Figure 4:
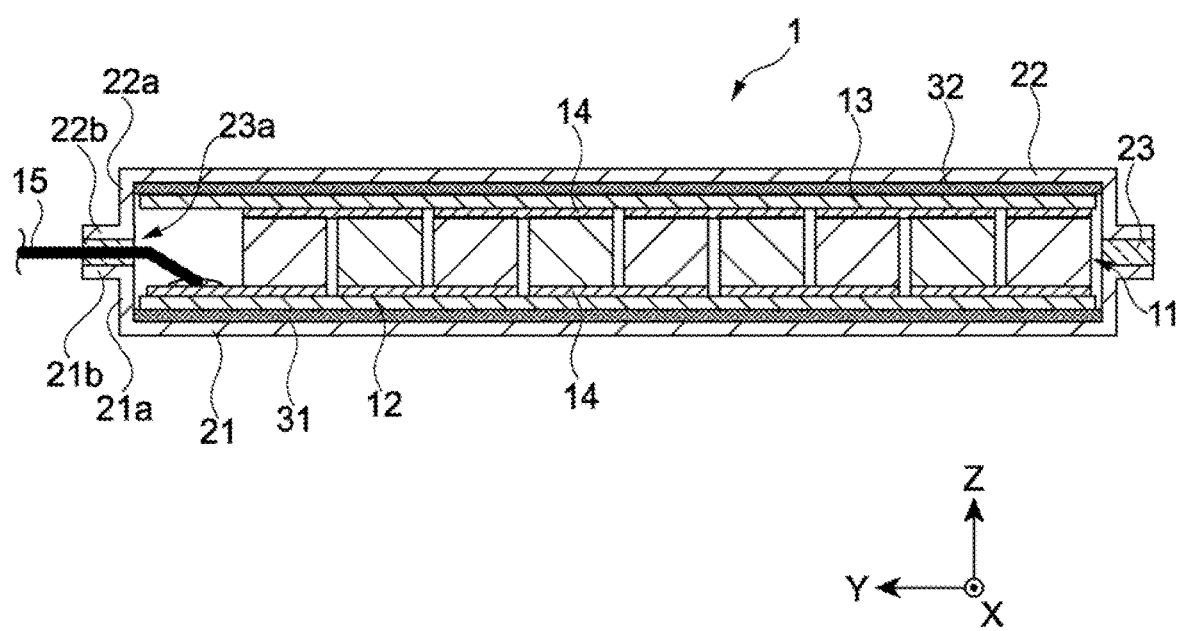
FIG. 4 is a cross-sectional view of the thermoelectric conversion module package taken along line B-B' in FIG. 1.

FIG. 1 and FIG. 2 are perspective views of a thermoelectric conversion module package 1 according to one embodiment of the present invention. FIG. 3 is a cross-sectional view of the thermoelectric conversion module package 1 taken along the line A-A' in FIG. 1. FIG. 4 is a cross-sectional view of the thermoelectric conversion module package 1 taken along line B-B' of FIG. 1.

The thermoelectric conversion module package 1 is provided with a thermoelectric conversion module 10 and a package 20, and has a constitution in which the thermoelectric conversion module 10 is hermetically sealed by the package 20. In FIG. 2, the package 20 is indicated by a broken line, with the thermoelectric conversion module 10 being shown by looking through the package 20.

The thermoelectric conversion module 10 constitutes the main body of the thermoelectric conversion module package 1 and is configured to exhibit the function of the thermoelectric conversion module package 1. The package 20 hermetically seals the thermoelectric conversion module 10.

(Thermoelectric Conversion Module 10)

The thermoelectric conversion module 10 of the thermoelectric conversion module package 1 is provided with a first substrate 12 that is a low temperature-side substrate, a second substrate 13 that is a high temperature-side substrate, a thermoelectric element 11, and lead wires 15. The first substrate 12 and the second substrate 13 are arranged to face each other. The thermoelectric element 11 is composed of a plurality of pairs of P-type and N-type thermoelectric elements, and is arranged between the substrate 12 and the substrate 13. The lead wires 15 are configured as a pair of conductive wires that are each connected to the first substrate 12.

The substrates 12 and 13 are each formed as a rectangular flat plate parallel to the XY plane. The substrates 12 and 13 are formed of an insulator material having excellent heat resistance. Since the thermoelectric conversion efficiency of the thermoelectric conversion module 10 is improved as the thermal conductivities of the substrates 12 and 13 are higher, it is preferable that the substrates 12 and 13 be formed thin with a material having a high thermal conductivity. As a material for forming the substrates 12 and 13, for example, a ceramic material such as aluminum nitride, aluminum oxide, silicon carbide, silicon nitride or the like can be used. Further, the substrates 12 and 13 may be substrates using resins as substrates, such as so-called flexible substrates.

Electrodes 14 are formed on each of the substrates 12 and 13. The electrodes 14 are formed on the upper surface of the first substrate 12 in FIG. 2 (the surface in the Z-axis positive direction), and the electrodes 14 is formed on the lower surface of the second substrate 13 in FIG. 2 (the surface in the negative direction of the Z axis). Therefore, the electrodes 14 of the first substrate 12 and the electrodes 14 of the second substrate 13 face each other in the Z-axis direction. Each electrode 14 is formed of a conductive material and, on the substrates 12 and 13, electrically connect pairs of the thermoelectric elements 11. The electrodes 14 are patterned so as to connect all the thermoelectric elements 11 in series between the substrates 12 and 13.

The electrodes 14 of the substrates 12 and 13 can be constituted using, for example, gold (Au), nickel (Ni), tin (Sn), copper (Cu), or alloys thereof. The substrates 12 and 13 can have a single layer structure or a multilayer structure in which a plurality of metal materials are combined.

The method of forming the electrodes 14 on the substrates 12 and 13 is not limited to a specific method and can be appropriately selected from known methods.

As an example, the electrodes 14 can be formed by subjecting the substrates 12 and 13 to a metal plating treatment. In the formation of the electrodes 14, multilayer plating can be used if necessary. The metal plating process can be performed at the wafer stage before being cut into the respective substrates 12 and 13.

Furthermore, the substrates 12 and 13 may be DBC (Direct Bonded Copper) substrates on which the electrodes 14 made of copper are directly bonded.

The thermoelectric elements 11 are composed of P-type thermoelectric elements 11 and N-type thermoelectric elements 11. The thermoelectric conversion module 10 of the thermoelectric conversion module package 1 has 49 pairs of thermoelectric elements 11 arranged in 10 rows in the X-axis direction and the Y-axis direction except for two corners in the Y-axis direction at which the lead wires 15 are connected. That is, between the substrates 12 and 13, 49 P-type thermoelectric elements 11 and 49 N-type thermoelectric elements 11 are alternately arranged.

The thermoelectric element 11 is formed of a thermoelectric material, that is, the P-type thermoelectric element 11 is formed of a P-type thermoelectric material and the N-type thermoelectric element 11 is formed of an N-type thermoelectric material. As the thermoelectric material forming the thermoelectric element 11, for example, a bismuth-tellurium-based thermoelectric material exhibiting good performance at a relatively low temperature can be used. Examples of the thermoelectric material forming the thermoelectric element 11 that can be adopted include a half-Heusler-based thermoelectric material, a silicide-based thermoelectric material, a lead-tellurium-based thermoelectric material, a silicon-germanium-based thermoelectric material, a skutterudite-based thermoelectric material, and a tetrahedrite-based thermoelectric material.

The lead wires 15 are joined to two corners of the first substrate 12 in the Y-axis direction and led out in the Y-axis direction. That is, the lead wires 15 are connected to the electrodes 14 at the two places where the thermoelectric element 11 is not disposed on the first substrate 12. Therefore, each lead wire 15 is electrically connected to the thermoelectric element 11 adjacent in the Y-axis direction via the electrode 14. For example, a known joining material such as solder, a brazing filler metal, a conductive paste or the like can be used for joining the lead wires 15 to the first substrate 12.

With the above configuration, in the thermoelectric conversion module 10 of the thermoelectric conversion module package 1, all the thermoelectric elements 11 are connected in series between the pair of lead wires 15.

It is a matter of course that the configuration of the thermoelectric conversion module 10 of the thermoelectric conversion module package 1 described above can be variously changed in accordance with the use of the thermoelectric conversion module package 1. For example, it is possible to appropriately change the number and arrangement of the thermoelectric elements 11, the shapes of the substrates 12 and 13, and the like from the above configuration. Further, the substrates 12 and 13 may be divided into a plurality.

(Package 20)

The package 20 includes a first metal foil 21, a second metal foil 22, and a resin portion 23. The first metal foil 21 is disposed on the lower surface of the thermoelectric conversion module 10 in FIG. 3 (the surface in the Z-axis negative direction), and covers the first substrate 12 side of the thermoelectric conversion module 10. The second metal foil 22 is disposed on the upper surface of the thermoelectric conversion module 10 in FIG. 3 (the surface in the Z-axis positive direction), and covers the second substrate 13 side of the thermoelectric conversion module 10. The resin portion 23 is provided along the outer edge portion of the thermoelectric conversion module 10 and hermetically seals the first metal foil 21 and the second metal foil 22.

A side wall portion 21a extending in the Z-axis positive direction to a position adjacent to the thermoelectric element 11 and a flange portion 21b extending from the upper end portion of the side wall portion 21a in the X axis and Y-axis positive direction are provided at the outer edge portion of the first metal foil 21. A side wall portion 22a extending in the Z-axis negative direction to a position adjacent to the thermoelectric element 11 and a flange portion 22b extending from the lower end portion of the side wall portion 22a in the X axis and Y-axis positive direction are provided at the outer edge portion of the second metal foil 22.

With such a configuration, the flange portion 21b of the first metal foil 21 and the flange portion 22b of the second metal foil 22 are opposed to each other in the Z-axis direction at an intermediate position in the Z-axis direction of the thermoelectric conversion module 10. The resin portion 23 is disposed between the flange portion 21b of the first metal foil 21 and the flange portion 22b of the second metal foil 22 and hermetically connects the first metal foil 21 and the second metal foil 22.

In the thermoelectric conversion module package 1, by providing the side wall portion 22a in the second metal foil 22, it is possible to dispose the resin portion 23 away from the second substrate 13 in the negative Z-axis direction. This makes it difficult for the heat of the second substrate 13 to be applied to the resin portion 23 during use of the thermoelectric conversion module package 1, so that the resin portion 23 is less likely to be damaged. Therefore, in the thermoelectric conversion module package 1, high durability and reliability are obtained.

In addition, in the package 20, by providing the flange portions 21b, 22b, it is possible to ensure a wide bonding area of the metal foils 21, 22 with the resin portion 23. As a result, the metal foils 21, 22 are better connected via the resin portion 23, so that the durability and reliability of the thermoelectric conversion module package 1 are improved.

From such a viewpoint, the dimension L (see FIG. 3) of the flange portions 21b, 22b in the X-axis direction and the Y-axis direction is preferably large to some extent. Specifically, it is preferably 2 mm or more, and more preferably 3 mm or more.

As shown in FIG. 4, the resin portion 23 is provided with an insertion portion 23a for drawing out the lead wires 15 of the thermoelectric conversion module 10 to the outside of the package 20. Each lead wire 15 is drawn out from the first substrate 12 to the height of the insertion portion 23a, and hermetically passed through the resin portion 23 at the insertion portion 23a. As a result, in the thermoelectric conversion module package 1, it is possible to expose only the lead wires 15 of the thermoelectric conversion module 10 to the outside of the package 20. As described above, in the package 20, sealing of the metal foils 21 and 22 and drawing out of the lead wires 15 can be performed collectively in the resin portion 23. Thereby, the manufacturing cost of the thermoelectric conversion module package 1 can be reduced.

Figure 5:
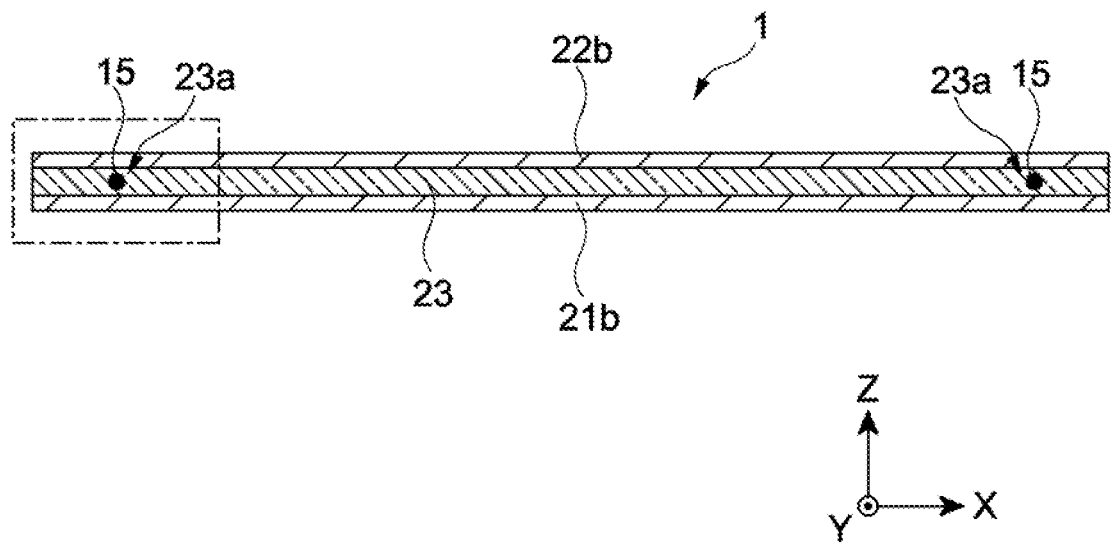
FIG. 5 is a cross-sectional view of the thermoelectric conversion module package taken along line C-C' in FIG. 1.
Figure 6:
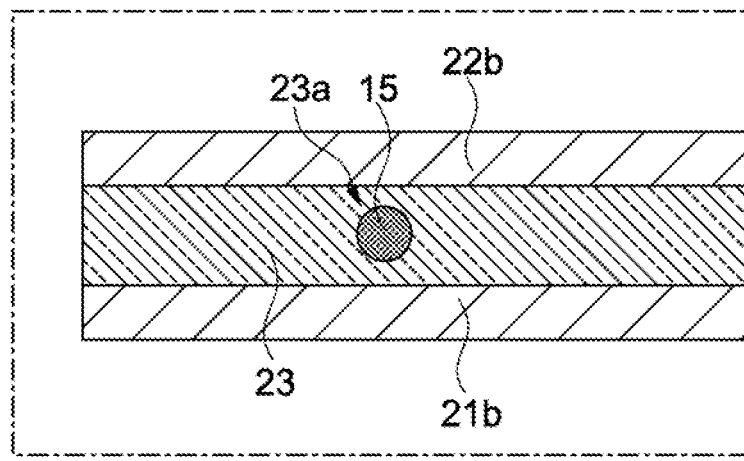
FIG. 6 is an enlarged cross-sectional view showing the configuration of the area surrounded by the long-dashed short-dashed line in FIG. 5 of the thermoelectric conversion module package.

FIG. 5 is a cross-sectional view of the thermoelectric conversion module package 1 taken along line C-C' of FIG. 1, showing a cross section of the flange portions 21b and 22b and the resin portion 23. FIG. 6 is an enlarged partial cross-sectional view showing the region indicated by the long-dashed short-dashed line in FIG. 5, particularly showing an enlargement of the cross section of the insertion portion 23a. As shown in FIG. 6, the entire circumference of the lead wire 15 is covered with the resin portion 23 at the insertion portion 23a, and the resin portion 23 separates the metal foils 21 and 22 from the flange portions 21b and 22b. Therefore, in the thermoelectric conversion module package 1, it is possible to prevent a short circuit caused by the lead wires 15 contacting the metal foils 21 and 22.

Figure 7:
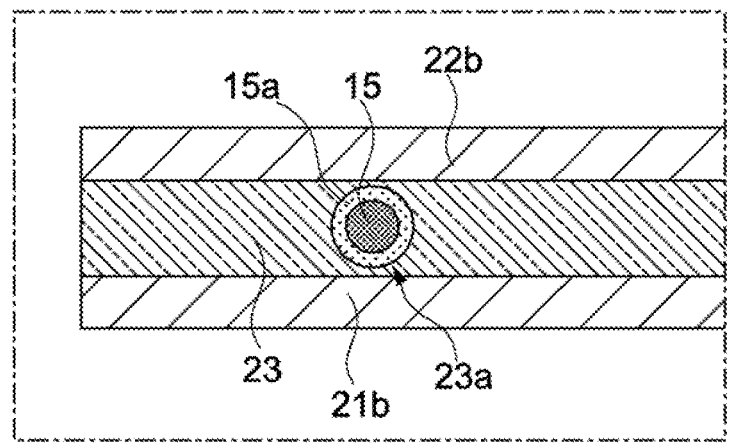
FIG. 7 is an enlarged cross-sectional view showing a modification of the configuration shown in FIG. 6 in the thermoelectric conversion module package.
Figure 7:
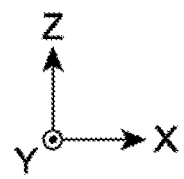

FIG. 7 is a partial cross-sectional view of a thermoelectric conversion module package 1 showing a modification of the configuration shown in FIG. 6. Each lead wire 15 may be provided with a covering portion 15a made of resin that hermetically covers the outer surface of the lead wire 15. As a result, even when a positional deviation occurs in the Z-axis direction (vertical direction) of the lead wire 15, the lead wire 15 is separated from the flange portions 21b and 22b of the metal foils 21 and 22 by the covering portion 15a. As a result, it is possible to more effectively prevent a short circuit caused by the lead wires 15 contacting the metal foils 21 and 22.

The covering portion 15a is not limited to a specific configuration provided it has insulation properties and can hermetically cover the lead wires 15. For example, as the coating portion 15a, a sealant film capable of being brought into close contact with the lead wires 15 by a heat sealer can be used. The material of the sealant film may be any material as long as it can adhere well to the resin portion 23 and may be the same as the resin portion 23 or different from the resin portion 23.

In the thermoelectric conversion module package 1, the resin portion 23 functions to suppress heat transfer between the metal foils 21 and 22, in addition to the functions of sealing the package 20 and drawing out the lead wires 15. That is, the resin portion 23 has a very low thermal conductivity compared with metal, and therefore can function to thermally insulate the metal foils 21 and 22. As a result, since the temperature difference between the first substrate 12, which is the low temperature-side substrate, and the second substrate 13, which is the high temperature-side substrate, is maintained in the thermoelectric conversion module 10, the cooling performance and the power generation performance of the thermoelectric conversion module package 1 are not impaired.

The thickness T of the resin portion 23 in the Z-axis direction (see FIG. 3) is preferably large in view of the thermal insulation of the metal foils 21 and 22 and the electrical insulation between the lead wires 15 and the metal foils 21 and 22. On the other hand, if the thickness T of the resin portion 23 is too large, the heat applied from the second metal foil 22 to the resin portion 23 easily accumulates, leading to damage of the resin portion 23 easily occurring.

From this viewpoint, the thickness T of the resin portion 23 is preferably 10 µm or more and 160 µm or less.

The resin material forming the resin portion 23 preferably has heat resistance. Examples of such a resin material include a polyolefin-based resin, an epoxy-based resin, a polyimide-based resin, a silicone-based resin, a phenol-based resin, a urethane-based resin, an acrylic-based resin, and the like. From the viewpoint of heat resistance, a polyolefin-based resin, an epoxy-based resin, a polyimide-based resin, a silicone-based resin and a phenol-based resin are preferable, and from the viewpoint of adhesion to the metal foils, a polyolefin-based resin, an epoxy-based resin, and a silicone-based resin are more preferable.

Examples of a polyolefin-based resin include low-density, medium-density or high-density polyethylene; an ethylene-α olefin copolymer; homo, block or random polypropylene; a propylene-α olefin copolymer and the like. From the viewpoint of heat resistance, homo, block or random polypropylene is preferable. Further, from the viewpoint of adhesion to the metal foils, the polyolefin-based resin may be graft-modified with an acid such as maleic anhydride.

The epoxy-based resin is composed of a thermosetting composition containing at least an epoxy resin and a curing agent, and may contain a thermoplastic resin from the viewpoint of imparting flexibility or may contain an inorganic filler from the viewpoint of improving heat resistance.

The epoxy resin is not particularly limited provided it is one having two or more epoxy groups in one molecule, with examples thereof including bisphenol F, bisphenol A, bisphenol S, resorcinol, dihydroxynaphthalene, dicyclopentadiene diphenol, dicyclopentadiene dixylenol and other diglycidyl ethers, epoxidized phenol novolac, epoxidized cresol novolac, epoxidized trisphenylolmethane, epoxidized tetraphenylolethane, epoxidized metaxylenediamine, cyclohexane epoxide and other alicyclic epoxies, and phenoxy resin.

Examples of the curing agent include a phenol resin, a melamine resin, a maleimide resin, a xylene resin, a furan resin, a cyanate ester resin, and an aromatic polyamine.

As the silicone-based resin, there are an addition-curable type, a condensation-curable type, and a UV-curable type, with an addition-curable type that is curable in a short time by heating being preferable. An addition-curable silicone resin is a compound having a reactive functional group such as an alkenyl group, with the alkenyl group being one that causes crosslinking with a curing agent such as organic peroxide and addition reaction with hydrogen siloxane, and cured by mixed curing or heat curing. Further, it may contain a catalyst such as platinum for promoting curing, and an adhesion imparting agent such as a coupling agent for improving adhesion to the metal foils.

The resin material forming the resin portion 23 may be another resin material provided it is one capable of obtaining high adhesiveness to the metal foils 21 and 22. The resin portion 23 may be constituted with a single resin material or may be constituted with a plurality of kinds of resin materials. Further, the resin material forming the resin portion 23 may be a sheet shape or a flow shape having viscosity.

(Heat Transfer Layers 31, 32)

As shown in FIGS. 3 and 4, the thermoelectric conversion module package 1 includes heat transfer layers 31 and 32. The first heat transfer layer 31 is provided between the first substrate 12 and the first metal foil 21 and is in close contact with the first substrate 12 and the first metal foil 21. The second heat transfer layer 32 is provided between the second substrate 13 and the second metal foil 22 and is in close contact with the second substrate 13 and the second metal foil 22. The heat transfer layers 31 and 32 improve the heat transfer between the substrates 12 and 13 and the metal foils 21 and 22 by reducing the thermal resistance between the substrates 12 and 13 and the metal foils 21 and 22, respectively.

As the heat transfer layers 31 and 32, for example, silicon grease, a graphite sheet, or a thermally conductive adhesive can be used. The members used for the heat transfer layers 31 and 32 may be the same or different. The combination of members used for the heat transfer layers 31 and 32 can be determined as appropriate. For example, silicon grease can be used for the first heat transfer layer 31 on the first substrate 12 side, which is the low-temperature side substrate, and a graphite sheet with high heat resistance can be used for the second heat transfer layer 32 on the second substrate 13 side, which is the high-temperature side substrate.

[Operational Effect and Detailed Configuration of Thermoelectric Conversion Module Package 1]

With the above configuration, in the thermoelectric conversion module package 1, it is possible to favorably perform thermoelectric conversion between the potential difference between the pair of lead wires 15 drawn to the outside of the package 20 and the temperature difference between the metal foils 21, 22.

In the thermoelectric conversion module package 1, since the thermoelectric conversion module 10 is hermetically sealed by the package 20, even when used in an environment where corrosion is likely to occur in the thermoelectric element 11, corrosion does not occur in the thermoelectric element 11. Moreover, in the thermoelectric conversion module package 1, the performance of the thermoelectric conversion module 10 is not affected by humidity even when used in a high humidity environment. Therefore, high durability and reliability are obtained in the thermoelectric conversion module package 1.

In the thermoelectric conversion module package 1, it is preferable that the space in the package 20 be a non-oxidizing atmosphere having a smaller amount of oxygen than the atmosphere. This makes it possible to prevent an increase in electrical resistance of the thermoelectric conversion module package 1 due to oxidation of the thermoelectric element 11. Accordingly, the thermoelectric conversion module package 1 can obtain even higher durability and reliability. More specifically, the space within the package 20 can be made a non-oxidizing atmosphere by enclosing an inert gas such as nitrogen or argon, for example. Further, the space in the package 20 may be depressurized.

Furthermore, the thermoelectric conversion module package 1 is extremely lightweight because the package 20 is composed of the lightweight metal foils 21 and 22 and the resin portion 23. This facilitates the handling of the thermoelectric conversion module package 1, so that it is possible to efficiently perform mounting of the thermoelectric conversion module package 1 to other devices and the like. In addition, since the metal foils 21 and 22 have flexibility, it is difficult for a load to be applied to the thermoelectric conversion module 10 due to thermal expansion or thermal contraction of the metal foils 21 and 22 during use of the thermoelectric conversion module package 1. As a result, durability and reliability are further improved in the thermoelectric conversion module package 1. In addition, by using the metal foils 21 and 22 for the package 20, the raw material cost can be reduced.

Since strength is required of the metal foils 21 and 22 to serve as the housing of the thermoelectric conversion module package 1, it is preferable not to make the metal foils 21 and 22 too thin. If the metal foils 21 and 22 are made too thin, discontinuous portions such as pinholes are generated in the metal foils 21 and 22, and the airtightness inside the package 20 may be impaired in some cases. From this viewpoint, the thickness of the metal foils 21 and 22 is preferably 10 µm or more, and more preferably 20 µm or more.

On the other hand, the metal foils 21 and 22 are also required to have flexibility for obtaining high adhesion to the heat transfer layer 32. From this viewpoint, the thickness of the metal foils 21 and 22 is preferably 300 µm or less, and more preferably 200 µm or less.

Examples of materials for forming the metal foils 21 and 22 include aluminum, aluminum alloys, copper, copper alloys, and stainless steel, with aluminum and aluminum alloys having light weight and flexibility being preferable. The metal foils 21 and 22 may be subjected to an adhesion improving treatment such as an alumite treatment, a chemical conversion treatment, a plating treatment, a coupling treatment and the like from the viewpoint of improving the adhesiveness with the resin material of the resin portion 23.

[Sealing Method of Thermoelectric Conversion Module 10 by Package 20]

FIGS. 8A to 8E are cross-sectional views illustrating a method of sealing the thermoelectric conversion module 10 with the package 20. The method of sealing the thermoelectric conversion module 10 by the package 20 will be described with reference to FIGS. 8A to 8E.

Figure 8A:
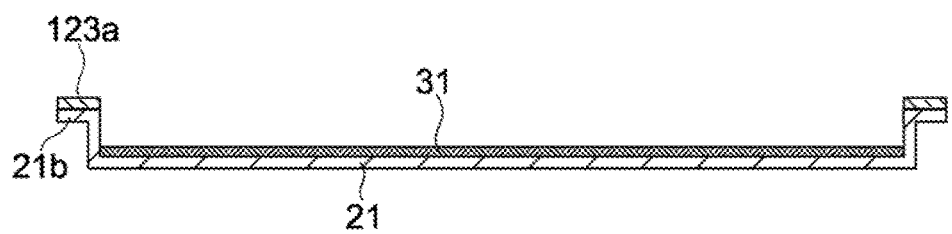
FIG. 8A is a cross-sectional view showing a first step in sealing the thermoelectric conversion module with the package in the thermoelectric conversion module package.
Figure 8B:
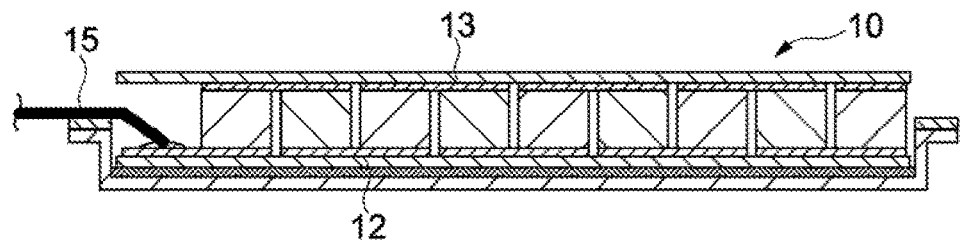
FIG. 8B is a cross-sectional view showing a second step in sealing the thermoelectric conversion module with the package in the thermoelectric conversion module package.
Figure 8C:
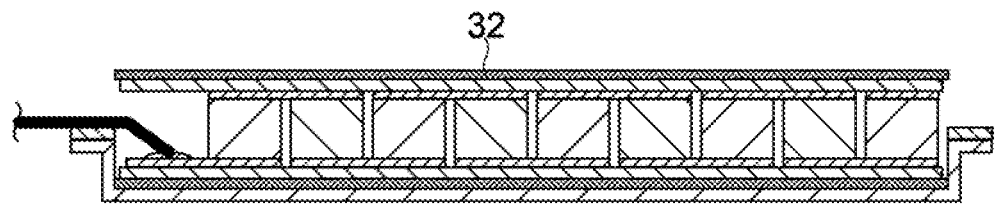
FIG. 8C is a cross-sectional view showing a third step in sealing the thermoelectric conversion module with the package in the thermoelectric conversion module package.

As shown in FIG. 8A, the heat transfer layer 31 is arranged on the bottom surface of the first metal foil 21 that is molded is advance by press molding or the like. A first resin piece 123a for forming each resin portion 23 is disposed on the flange portion 21b of the first metal foil 21. Next, as shown in FIG. 8B, the thermoelectric conversion module 10 is arranged on the heat transfer layer 31. At this time, the lead wires 15 of the thermoelectric conversion module 10 are arranged on each first resin piece 123a. Subsequently, as shown in FIG. 8C, the heat transfer layer 32 is disposed on the second substrate 13 of the thermoelectric conversion module 10.

Figure 8D:
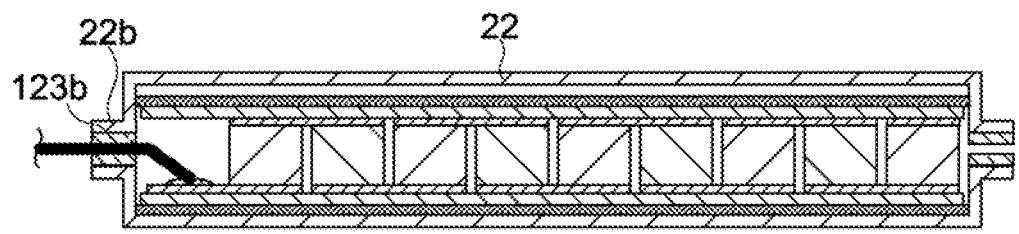
FIG. 8D is a cross-sectional view showing a fourth step in sealing the thermoelectric conversion module with the package in the thermoelectric conversion module package.
Figure 8E:
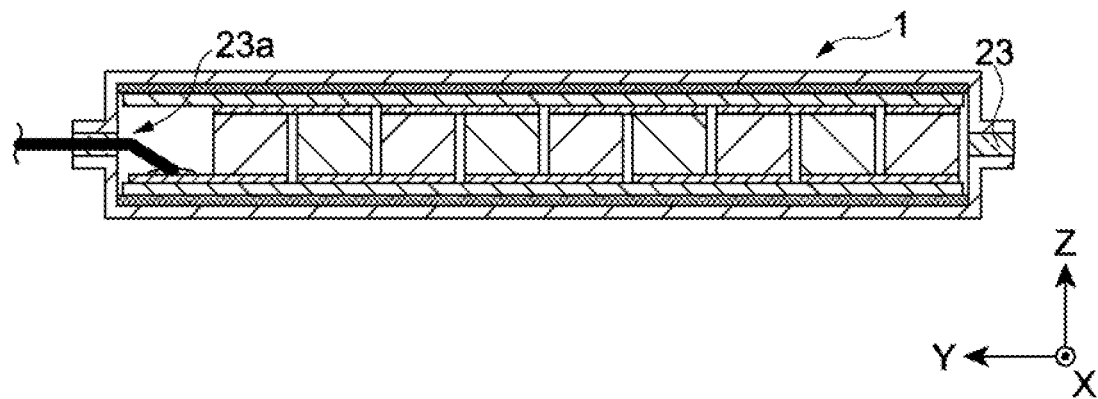
FIG. 8E is a cross-sectional view showing a fifth step in sealing the thermoelectric conversion module with the package in the thermoelectric conversion module package.

Thereafter, as shown in FIG. 8D, the second metal foil 22 molded in advance by press molding or the like is placed on the heat transfer layer 32. On the flange portion 22b of the second metal foil 22, a second resin piece 123b formed similarly to the first resin piece 123a is disposed, and each lead wire 15 is sandwiched between the resin pieces 123a, 123b. Next, heat is applied to the assembly shown in FIG. 8D to weld the resin pieces 23a and 123b, whereby the resin portion 23 is formed. Thereby, the thermoelectric conversion module package 1 shown in FIG. 8E is obtained.

In this method, since the metal foils 21 and 22 are sealed by the welding of the resin pieces 123a and 123b, it is unnecessary to expose the thermoelectric conversion module 10 to a high temperature as compared with a method such as welding. Therefore, the performance and reliability of the thermoelectric conversion module package 1 are hardly deteriorated. In addition, since the heat capacities of the metal foils 21 and 22 are small and the temperature of the resin pieces 123a and 123b rises in a short time, the metal foils 21 and 22 can be sealed in a short time.

The method for forming the resin portion 23 in the package 20 is not limited to the welding of the resin pieces 123a and 123b, and any known method can be adopted freely. As an example, the resin portion 23 can be formed with an adhesive. In this case, the adhesive is applied to the flange portions 21b and 22b of the metal foils 21 and 22, and the adhesive is cured in a state in which the lead wires 15 are passed through the adhesive between the flange portions 21b and 22b.

[Modification of Thermoelectric Conversion Module Package 1]

(Modification of Package 20)

Figure 9A:
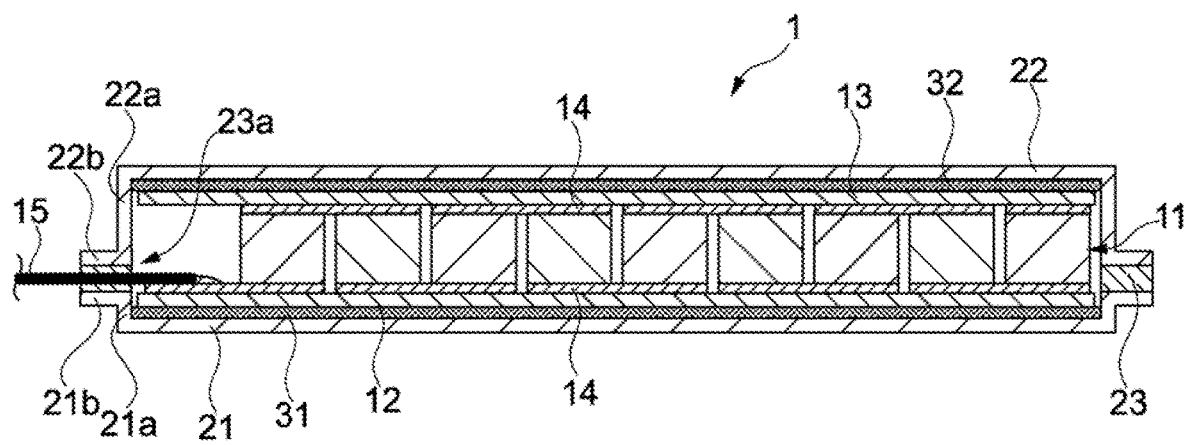
FIG. 9A is a cross-sectional view showing a modification of the package in the thermoelectric conversion module package.
Figure 9B:
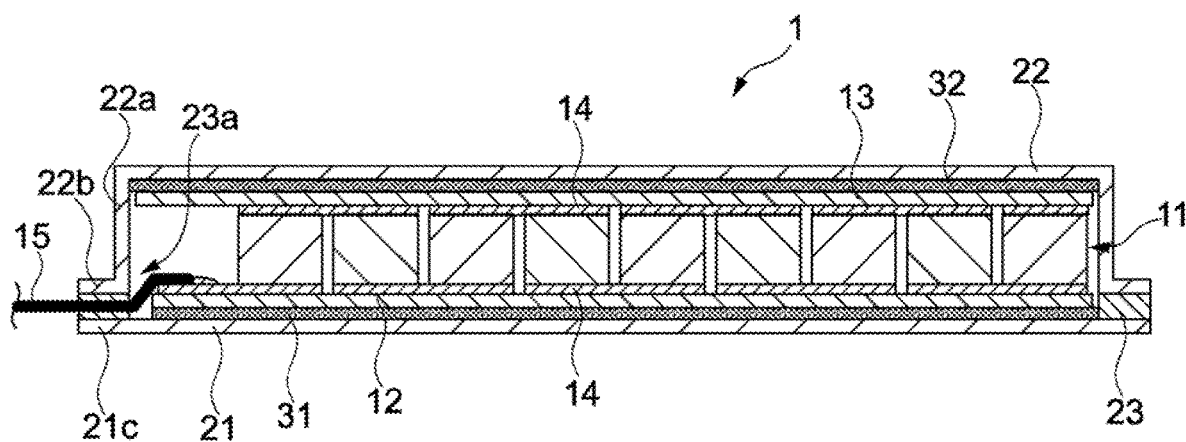
FIG. 9B is a cross-sectional view showing another modification of the package in the thermoelectric conversion module package.
Figure 9B:
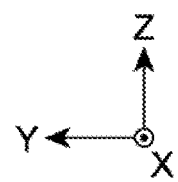

FIGS. 9A and 9B are cross-sectional views of a thermoelectric conversion module package 1 showing a modification of the package 20.

In the package 20 shown in FIG. 9A, the side wall portion 21a of the first metal foil 21 is short, and the side wall portion 22a of the second metal foil 22 is long. Therefore, the flange portions 21b and 22b and the resin portion 23 are arranged at low positions in the Z-axis direction. As a result, since the resin portion 23 can be further separated from the second substrate 13 in the negative direction of the Z axis (the lower side in FIG. 9A), the heat of the second substrate 13 is less likely to be applied to the resin portion 23. Therefore, in the thermoelectric conversion module package 1, durability and reliability can be improved.

The first metal foil 21 of the package 20 shown in FIG. 9B is not provided with the side wall portion 21a, and instead there is provided an expansion portion 21c that expands in the X-axis and Y-axis positive directions (outward) from the region facing the first substrate 12. That is, the first metal foil 21 is formed in a flat plate shape. On the other hand, the side wall portion 22a of the second metal foil 22 is made longer. Accordingly, since the resin portion 23 can be further separated from the second substrate 13 in the negative Z-axis direction (downward), the heat of the second substrate 13 has less of a tendency to be applied to the resin portion 23. Therefore, in the thermoelectric conversion module package 1, durability and reliability can be further improved.

(Modification of Thermoelectric Conversion Module 10)

Figure 10:
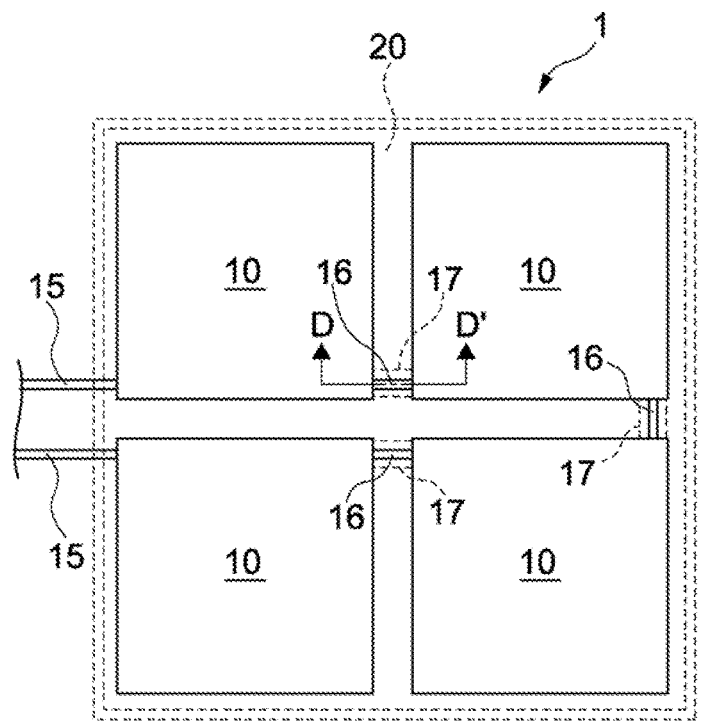
FIG. 10 is a plan view showing a modification of the thermoelectric conversion module in the thermoelectric conversion module package.

FIG. 10 is a cross-sectional view of the thermoelectric conversion module package 1 having an assembly of the thermoelectric conversion module 10 including a plurality of the thermoelectric conversion modules 10. The thermoelectric conversion module package 1 has an assembly of four thermoelectric conversion modules 10. Further, the thermoelectric conversion module package 1 has connecting portions 16 for connecting the four thermoelectric conversion modules 10 in series. Each connecting portion 16 is formed of, for example, a conductive wire or a metal foil. The lead wires 15 are respectively drawn out from the thermoelectric conversion modules 10 at both ends of the series connection in the four thermoelectric conversion modules 10.

In this manner, in the thermoelectric conversion module package 1, by combining a plurality of the thermoelectric conversion modules 10, it is possible to increase the area without increasing the size of each thermoelectric conversion module 10. In addition, in the thermoelectric conversion module package 1, since the thermal stress is mitigated more favorably by the configuration divided into a plurality of thermoelectric conversion modules 10 than the configuration in which the thermoelectric conversion module 10 itself is enlarged, excellent durability and reliability are obtained.

Figure 11:
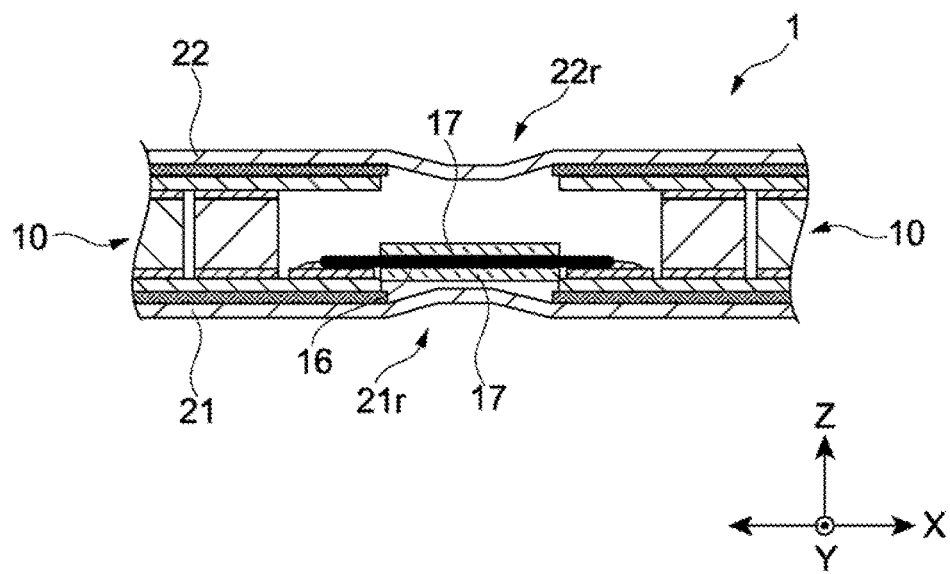
FIG. 11 is a partial cross-sectional view of the thermoelectric conversion module package along line D-D' in FIG. 10.

FIG. 11 is a cross-sectional view of the thermoelectric conversion module package 1 taken along line D-D' in FIG. 10, and shows the area between the two thermoelectric conversion modules 10. In the thermoelectric conversion module package 1, the metal foils 21 and 22 are not held in the region between the two thermoelectric conversion modules 10. Therefore, concave portions 21r and 22r recessed inward in the Z-axis direction may be generated in the metal foils 21 and 22. The concave portions 21r and 22r of the metal foils 21 and 22 are particularly likely to occur in the configuration in which the space inside the package 20 is depressurized. When the concave portions 21r and 22r make contact with the connecting portion 16, a short circuit occurs due to conduction between the connecting portions 16.

On the other hand, the thermoelectric conversion module package 1 is provided with two resin sheets 17 sandwiching the connecting portion 16 in the Z-axis direction. Thereby, it is possible to prevent the recessed portions 21r and 22r of the metal foils 21 and 22 from contacting the connecting portions 16. Note that in the case of using a covered wire or the like which is insulated in advance as the connecting portion 16, it is not necessary to provide the resin sheet 17. The lead wire 15 provided with the covering portion 15a such as a sealant film shown in FIG. 7 may be used as the connecting portion 16. In this case as well, there is no need to provide the resin sheet 17.

[Embodiments]

Hereinbelow, the present invention will be described in detail with embodiments, but the present invention is not limited by the description below.

(Materials Used)

Materials used for manufacturing the thermoelectric conversion module packages of the embodiments and comparative example are shown below.

(Thermoelectric Conversion Module)

Thermoelectric conversion module A-1: The size of the first substrate 12 is set to be 40 mm in width (X-axis direction), 32 mm in length (Y-axis direction), 2 mm in height (Z-axis direction), and the size of the second substrate 13 is set to be 40 mm in width (X-axis direction), 35 mm in length (Y-axis direction), and 2 mm in height (Z-axis direction). The thermoelectric element 11 is formed with a bismuth telluride-based thermoelectric material.

Thermoelectric conversion module A-2: The size of the first substrate 12 is set to be 40 mm in width (X-axis direction), 38 mm in length (Y-axis direction), 2 mm in height (Z-axis direction), and the size of the second substrate 13 is set to be 40 mm in width (X-axis direction), 35 mm in length (Y-axis direction) of 40 mm, and 2 mm in height (Z-axis direction). The thermoelectric element 11 was formed with a bismuth telluride-based thermoelectric material.

(Heat Transfer Layer)

Heat Transfer Layer B-1: Silicon grease
Heat Transfer Layer B-2: Graphite sheet (Metal Foil)

Metal foil C-1: Aluminum foil (10 μm thickness)
Metal foil C-2: Aluminum foil (150 μm thickness)
Metal foil C-3: Aluminum foil (50 μm thickness)
Metal foil C-4: Aluminum foil (100 μm thickness)
Metal foil C-5: Aluminum foil (200 μm thickness)
Metal foil C-6: Copper foil (50 μm thickness)
Metal foil C-7: Stainless steel foil (50 μm thickness)
Metal foil C-8: Aluminum foil (300 μm thickness)
Resin D-1: Polypropylene resin (50 μm thickness)
Resin D-2: Polypropylene resin (10 μm thickness)
Resin D-3: Polypropylene resin (160 μm thickness)
Resin D-4: Polyimide resin (50 μm thickness)
Resin D-5: Epoxy resin (50 μm thickness)
Resin D-6: Silicone resin (50 μm thickness)

Configuration of Embodiments and Comparative Example

In the thermoelectric conversion module packages of the embodiments and the comparative example, the thermoelectric conversion module 10, the heat transfer layer 31, the heat transfer layer 32, the first metal foil 21, the second metal foil 22 and the resin portion 23 were constituted using the materials of Table 1.

TABLE 1

| Embodiments & Comparative Example | Thermoelectric Conversion Module 10 | Heat Transfer Layer 31 | Heat Transfer Layer 32 | First Metal Foil 21 | Second Metal Foil 22 | Resin Portion 23 |
|---|---|---|---|---|---|---|
| Embodiment 1 | A-1 | B-1 | B-2 | C-1 | C-1 | D-1 |
| Embodiment 2 | A-2 | B-1 | B-2 | C-2 | C-2 | D-1 |
| Embodiment 3 | A-1 | B-2 | B-2 | C-3 | C-3 | D-1 |
| Embodiment 4 | A-1 | B-1 | B-2 | C-3 | C-3 | D-1 |
| Embodiment 5 | A-1 | B-1 | B-2 | C-4 | C-4 | D-1 |
| Embodiment 6 | A-1 | B-1 | B-2 | C-5 | C-5 | D-1 |
| Embodiment 7 | A-1 | B-1 | B-2 | C-6 | C-6 | D-1 |
| Embodiment 8 | A-1 | B-1 | B-2 | C-7 | C-7 | D-1 |
| Embodiment 9 | A-1 | B-1 | B-2 | C-3 | C-3 | D-2 |
| Embodiment 10 | A-1 | B-1 | B-2 | C-3 | C-3 | D-3 |
| Embodiment 11 | A-1 | B-1 | B-2 | C-3 | C-3 | D-4 |
| Embodiment 12 | A-1 | B-1 | B-2 | C-3 | C-3 | D-5 |
| Embodiment 13 | A-1 | B-1 | B-2 | C-3 | C-3 | D-6 |
| Embodiment 14 | A-1 | B-1 | B-2 | C-8 | C-3 | D-1 |
| Embodiment 15 | A-1 | B-1 | B-2 | C-3 | C-8 | D-1 |
| Comparative Example 1 | A-1 | N/A | N/A | N/A | N/A | N/A |

[Evaluation]
The thermoelectric conversion module packages of the embodiments and the comparative example were evaluated according to the following method.
[Evaluation of Durability]
Durability tests were conducted on the thermoelectric conversion module packages of the embodiments and the comparative example. In the durability test, while keeping the temperature of the first metal foil 21 on the first substrate 12 at 90° C., the temperature of the second metal foil 22 on the second substrate 13 was changed in the range of 90° C. to 330° C. More specifically, a cycle was performed 1,000 times in which the temperature of the second metal foil 22 on the second substrate 13 was raised from 90° C. to 330° C. in 5 minutes, held at 330° C. for 2 minutes, cooled from 330° C. to 90° C. in 5 minutes, and held at 90° C. for 2 minutes.

At 250 cycles, 500 cycles, 750 cycles, and 1,000 cycles, the AC electrical resistance of each sample was measured, and the percentage change in the electrical resistance from the AC electrical resistance prior to the durability test (0 cycle) was calculated.

The percentage change in the electrical resistance thus obtained was evaluated according to the following criteria:

"A": Percentage change in electrical resistance is less than 2%.

"B": Percentage change in electrical resistance is 2% or more and less than 5%.

"C": Percentage change in electrical resistance is 5% or more.

The evaluation results are shown in Table 2.

TABLE 2

| Embodiments & Comparative Example | Durability (Percentage Change in Electrical Resistance) | | | |
|---|---|---|---|---|
| | 250 Cycles | 500 Cycles | 750 Cycles | 1,000 Cycles |
| Embodiment 1 | A | A | A | A |
| Embodiment 2 | A | A | A | A |
| Embodiment 3 | A | A | A | A |
| Embodiment 4 | A | A | A | A |
| Embodiment 5 | A | A | A | B |
| Embodiment 6 | A | A | A | A |
| Embodiment 7 | A | A | A | A |
| Embodiment 8 | A | A | A | B |
| Embodiment 9 | A | A | A | B |
| Embodiment 10 | A | A | A | B |
| Embodiment 11 | A | A | A | A |
| Embodiment 12 | A | A | A | A |
| Embodiment 13 | A | A | A | A |
| Embodiment 14 | A | B | B | C |
| Embodiment 15 | B | B | C | C |
| Comparative Example 1 | C | C | C | C |

In the embodiments having the constitution of the present invention, a thermoelectric conversion module package excellent in durability could be provided.
[Other Embodiments]
Although the embodiment of the present invention was described above, the present invention is not limited only to the above-described embodiment, and it goes without saying that various modifications can be made without departing from the gist of the present invention.

For example, in the above-described embodiment, a constitution was described in which the thermoelectric conversion module 10 of the thermoelectric conversion module package 1 has only one thermoelectric element layer. However, a multilayer constitution in which the thermoelectric conversion module 10 has a plurality of thermoelectric element layers is also possible. In addition, the thermoelectric conversion module package 1 may have an assembly of the thermoelectric conversion module 10 including a plurality of thermoelectric conversion modules 10 stacked in the Z-axis direction.

What is claimed is:

1. A thermoelectric conversion module package comprising:
    a thermoelectric conversion module comprising a first and a second substrate opposed to each other, a plurality of thermoelectric elements arranged between the first and second substrates, and a first and a second lead wire drawn out from one of the first and second substrates; and
    a package comprising a first metal foil covering the first substrate on one side of the thermoelectric conversion module, a second metal foil covering the second substrate on the other side of the thermoelectric conversion module, a resin portion hermetically connecting the first metal foil and the second metal foil along an outer edge portion of the thermoelectric conversion module, and an insertion portion for hermetically passing the first and second lead wires through the resin portion, an entire circumference of the first and second lead wires being covered with the resin portion,
    wherein the second metal foil comprises a side wall portion extending toward the first metal foil at the outer edge portion of the thermoelectric conversion module, and a flange portion protruding outward from the side wall portion, and
    wherein the resin portion connects the first metal foil and the flange portion.

2. The thermoelectric conversion module package according to claim 1, wherein the resin portion is disposed at a position closer to the first substrate than the second substrate.

3. The thermoelectric conversion module package according to claim 2, wherein:
    the first metal foil comprises an expansion portion that is expanded outward from the region facing the first substrate; and
    the resin portion connects the expansion portion and the flange portion.

4. The thermoelectric conversion module package according to claim 1, comprising:
    a thermoelectric conversion module assembly including a plurality of the thermoelectric conversion modules; and
    a connecting portion that electrically connects the plurality of the thermoelectric conversion modules.

5. The thermoelectric conversion module package according to claim 1, wherein the first and second lead wires are provided with a covering portion that hermetically covers an outer surface of the first and second lead wires.

6. The thermoelectric conversion module package according to claim 5, wherein the covering portion is made of a material different from that of the resin portion.

* * * * *